United States Patent
Wise et al.

[19]

[11] Patent Number: 6,093,281
[45] Date of Patent: Jul. 25, 2000

[54] BAFFLE PLATE DESIGN FOR DECREASING CONDUCTANCE LOST DURING PRECIPITATION OF POLYMER PRECURSORS IN PLASMA ETCHING CHAMBERS

[75] Inventors: Richard S. Wise, Beacon; David M. Dobuzinsky, Hopewell Junction; William C. Wille, Red Hook, all of N.Y.

[73] Assignee: International Business Machines Corp., Armonk, N.Y.

[21] Appl. No.: 09/031,232

[22] Filed: Feb. 26, 1998

[51] Int. Cl.⁷ .................................................. C23C 16/00
[52] U.S. Cl. .................. 156/345; 118/723 E; 118/723 I; 118/723 MW; 118/715; 204/298.07
[58] Field of Search .................. 118/715, 723 E, 118/723 I, 723 MW; 204/298.07; 156/345

[56] References Cited

U.S. PATENT DOCUMENTS

| | | |
|---|---|---|
| 3,296,115 | 1/1967 | Laegreid et al. . |
| 4,369,730 | 1/1983 | Izu et al. .................................. 118/723 |
| 4,798,165 | 1/1989 | deBoer et al. . |
| 4,986,216 | 1/1991 | Ohmori et al. . |
| 5,292,396 | 3/1994 | Takashima et al. . |
| 5,516,367 | 5/1996 | Lei et al. . |

*Primary Examiner*—Maria Nuzzolillo
*Assistant Examiner*—Monique M. Wills
*Attorney, Agent, or Firm*—Pollock, Vande Sande & Amernick

[57] ABSTRACT

A baffle plate for semiconductor processing apparatus. The baffle plate includes a plurality of slits. A plurality of fins are located between adjacent slits. The fins have varying heights and a supporting portion interconnects the fins.

21 Claims, 5 Drawing Sheets

BAFFLE PLATE DESIGN FOR DECREASING CONDUCTANCE LOST DURING PRECIPITATION OF POLYMER PRECURSORS IN PLASMA ETCHING CHAMBERS

FIELD OF THE INVENTION

The invention relates to semiconductor processing devices. In particular, the invention relates to a baffle plate through which material exiting the processing chambers must pass. The baffle plate described herein decreases constriction of spaces in the baffle plate as a result of materials being deposited upon the baffle plate during semiconductor processing.

BACKGROUND OF THE INVENTION

Processing chambers are utilized in a wide variety of manufacturing processes. For example, processing chambers are utilized for a variety of applications in semiconductor device manufacture. Typically, a material is introduced into the chamber. The material reacts with one or more substrates or workpieces arranged within the chamber. Examples of such chambers include plasma reactors. In a plasma reactor, a plasma may be introduced into the processing chamber to react with a substrate or workpiece. A particular example of a plasma reactor is a plasma etching chamber. Other examples of treatment chambers utilized in semiconductor device manufacture include plasma ashing chambers, plasma chemical vapor deposition (CVD), among others.

Typically, the plasma reacts with material on the substrate or workpiece. As reactions take place between the plasma and the material in substrate or workpiece, the materials resulting from the reactions may enter the atmosphere of the processing chamber. To insure flow of plasma through the chamber, typically, such chambers have an exhaust. A fan, pump, or other apparatus helps to insure flow of gases, plasma, and other materials out of the chamber.

Often, an element is placed in the chamber such that gases and/or other materials passing from the chamber to the exhaust must pass through the element to help prevent passage of unwanted materials into the exhaust. An example of such an element is a baffle plate. For example, baffle plates are often used in polymerizing plasma reactors to prevent unwanted deposition of polymer in a pump or on regions of a processing chamber that are difficult to clean, in particular, difficult to wipe clean. Material will build up on a baffle plate or other element until the baffle plate or element becomes too clogged to permit flow of materials and/or control of pressure within the chamber.

Once the baffle plate or other element becomes clogged, the chamber must be shut down, opened, and cleaned. This can be a time-consuming and expensive process. For example, if a processing chamber is shut down, then no processing can take place.

SUMMARY OF THE PRESENT INVENTION

An object of the present invention is to provide a baffle plate for a semiconductor processing chamber that reduces the frequency of clogging the baffle plate with materials generated during the semiconductor processing.

Accordingly, an advantage of the present invention is that it extends the useful time of the processing chamber, while reducing the cleaning frequency.

In accordance with these and other objects and advantages, aspects of the present invention provide a baffle plate for a semiconductor processing apparatus. The baffle plate includes a plurality of slits. The baffle plate also includes a plurality of fins between adjacent slits. The fins have varying heights. A supporting portion interconnects the fins.

According to other aspects, the present invention provides a semiconductor processing apparatus. The apparatus includes a treatment chamber. A support is provided for supporting a substrate to be treated. The treatment chamber includes a reactant inlet and a reactant outlet. A pump directs reactant out of such chamber through said reactant outlet. A baffle plate is provided wherein the reactant passes through the baffle plate prior to exiting the chamber. The baffle plate includes a plurality of slits and a plurality of fins between the slits. The fins have varying heights and are interconnected by a supporting portion.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

As stated above, the present invention provides a baffle plate that may be used with a semiconductor processing apparatus. Baffle plates are utilized to prevent undesired flow of materials out of processing chambers so as to help prevent build-up of these materials outside the chamber and possible damage to apparatus such as fans and pumps designed to create a flow of material through the chamber and to control conditions within the chamber.

Figure 1:
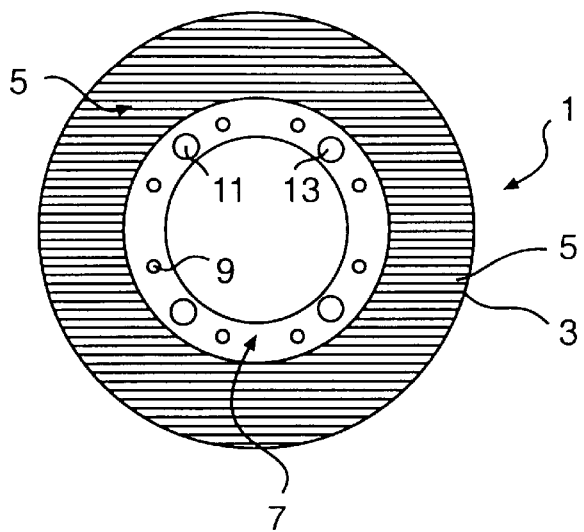
FIG. 1 represents an overhead view of an embodiment of a baffle plate that may be utilized with a semiconductor processing chamber.

FIG. 1 provides an overhead view of an embodiment of a baffle plate 1. Typically, a baffle plate includes a plurality of fins 3 and slits 5. The slits permit passage of materials through the baffle plate. However, preferably, the width of the slits is sufficiently narrow so as to help prevent passage of undesirable materials or to hinder the passage of undesirable materials through the slits. For example, the width of the slits 5 may be based upon the diffusivity of molecules that it is desired to prevent from exiting the chamber or passing beyond the baffle plate.

The baffle plate 1 may include an interior ring 7 for interconnecting the fins 3 of the baffle plate. The baffle plate 1 may also include an external ring (not shown) for connecting the fins to the baffle plate. The interior ring 7 may also receive a workpiece or workpiece support for mounting substrates or workpieces to be processed within the chamber. The internal ring 7 may include internal threads 9 and/or passages 11 and 13 for engaging a substrate or workpiece support.

Figure 2:
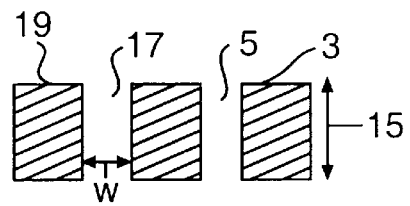
FIG. 2 represents a cross-sectional view of a portion of a known baffle plate illustrating slits and fins of the baffle plate.

Typically, as illustrated in FIG. 2, all fins of the baffle plate 1 terminate at the same vertical level. The fins have a height 15 and a width 17.

During operation of the processing chamber, material is deposited on the top surfaces 19 of the fins. For example, in a polymerizing plasma reactor, polymer and/or polymer precursors may be deposited on the surface of the fins. The polymer may condense out of the plasma onto the baffle plate.

As processing continues, material, such as the polymer or polymer precursors, continues to build up. At a certain point, the polymer or other material typically builds up to a point where it starts to constrict the slits, effectively narrowing the slits. At some point, the desired flow through the baffle plate cannot be achieved and/or conditions, such as pressure in the treatment chamber, can no longer be controlled. At this point, the chamber must be cleaned.

Cleaning the chamber involves shutting it down. The cleaning may require adding materials, such as solvents, to remove material built up on the baffle plate and other surfaces. Cleaning may also require opening of the chamber to remove materials deposited on the baffle plate. Therefore, the chamber is not in use during cleaning and unproductive. Furthermore, cleaning the chamber takes time and material that could otherwise be utilized for productive purposes.

Figure 3:
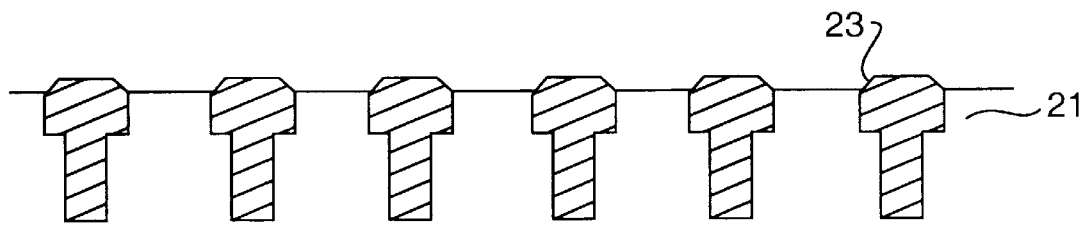
FIG. 3 represents a cross-sectional view of another embodiment of a known baffle plate illustrating fins that end in a "T" configuration.

FIG. 3 illustrates an alternative embodiment of known baffle plate fins. The fins shown in FIG. 3 include a "T"-shaped cap 21 having a beveled surface 23. It is not necessary that the fins terminate in a T-shaped cap to be beveled. For example, the fins shown in FIG. 2 could also have a beveled top surface without flaring out to make a "T".

The present invention provides a baffle plate design that decreases the impact of material deposition on the conductance of the baffle plate while maintaining the same effective area for material deposition. Accordingly, the present invention reduces the frequency that a processing chamber including the baffle plate will require cleaning. Additionally, the present invention does not reduce the ability of the baffle plate to block deposition on the baffle plate.

The present invention accomplishes these objects and advantages while retaining the conductance of the baffle plate and reducing the effect of material deposition on flow through the baffle plate. For example, in a polymerizing plasma reactor, the present invention decreases the impact of polymer deposition on the conductance of the baffle plate while maintaining the same active area for polymer condensation. A baffle plate according to the present invention utilized in polymerizing plasma reactors will not reduce the ability of the baffle plate to block polymer formation.

The present invention is by no means limited for use in polymerizing plasma reactors. It may be utilized in plasma etching chambers and have industry-wide applications.

The baffle plate prevents, or helps to prevent, passage of material beyond the baffle plate. For example, the baffle plate may prevent passage of material through the baffle plate into undesirable portions of the plasma reactor such as unaccessible regions. The baffle plate may also prevent materials from passing into a pump where they might be deposited on pump blades. Deposition on pump blades, for example, could hinder the effective operation of the pump, as well as damage the pump.

Preferably, the slits in a baffle plate are wide enough to maintain processing pressure, but not so wide as to permit too much material, such as polymer or plasma, to pass through. Accordingly, the baffle plate may permit some polymer and/or plasma to pass through the slits. In the context of a polymerizing plasma reactor, the slits preferably are smaller than the mean free path of the polymer precursor.

According to one embodiment, the slits are smaller than about 4 mm when utilizing an operating pressure of about 40 mT. By being smaller than the mean free path of the polymer precursor, the slits prevent excessive diffusive flux through the plate. The slits may also be thinner than the plasma sheaths to prevent plasma from creating additional formation of precursors on the downstream side of the baffle plate. Preferably, the dimensions of the slits are such that any flow of gas through the baffle plate is molecular.

Figure 4:
FIG. 4 represents a photomicrograph of build-up on a fin of a known baffle plate.
Figure 5:
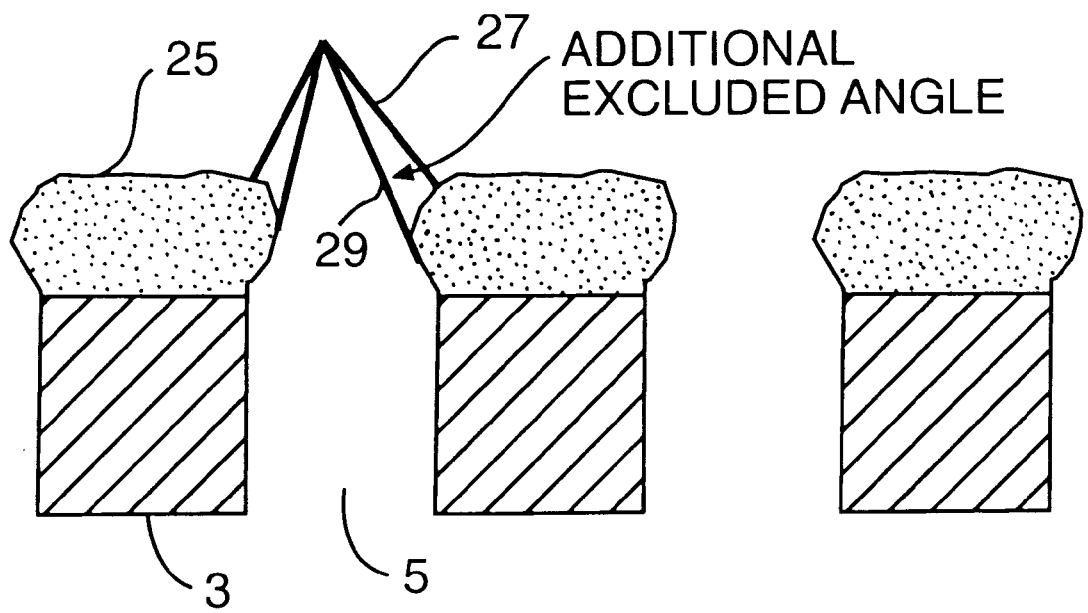
FIG. 5 illustrates a cross-sectional view of a known baffle plate showing build-up of materials on fins of the baffle plate.

FIG. 4 and FIG. 5 illustrate patterns of deposition on fins of a known baffle plate design. FIG. 4 represents a photomicrograph illustrating a fin of a known baffle plate having beveled top edges showing deposition of material on the top and beveled surfaces of the fin. FIG. 5 provides a cross-sectional drawing of fins of a know baffle plate design illustrating deposition of material on top surfaces of the fins.

Examination of the fins illustrated in FIG. 4 and FIG. 5 indicates that materials typically are deposited substantially entirely on the top surfaces of the baffle plate fins that face the flow of material toward the baffle plate. FIG. 5 illustrates how material deposited on the side of the fins diminishes the width of slits between the fins. Diminishing the width produces a subsequent loss of area, leading to a loss of conductance through the baffle plate.

FIG. 5 illustrates a pattern of deposition typically referred to as "breadloafing". The top surfaces of the fins typically are beveled to reduce the impact of breadloafing, as well as to increase the surface area available for deposition of materials on the fins. As shown in FIG. 5, the material 25 deposited on the fin 3 reduces the width of the slits 5 between the fins. FIG. 5 also illustrates a reduced angle 29 created by deposition of material 25. Angle 27 illustrates the wider angle available for movement of material through the slits 5 prior to deposition of material 27 on the fins.

To address the problem of reduced flow through a baffle plate requiring frequent shutdown of the processing apparatus and cleaning, the present invention provides a new baffle plate design that improves the ability of the baffle plate to permit the deposition of materials while increasing the time period between required cleanings. The present invention achieves these objectives while not permitting increased diffusive flow through the baffle plate so as not to result in additional undesirable passage of materials beyond the baffle plate. To accomplish these goals, the present invention provides a baffle plate that includes fins having edges facing the flow at different levels.

Figure 6:
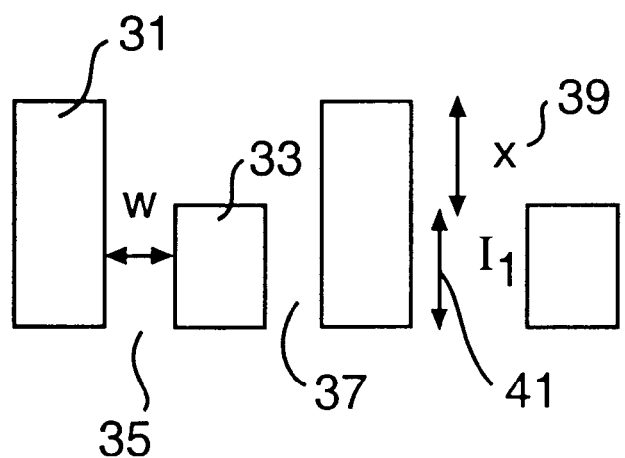
FIG. 6 represents a-cross-sectional view of an embodiment of a baffle plate according to the present invention illustrating slits and fins of the baffle plate.

FIG. 6 provides an illustration of an embodiment of the baffle plate according to the present invention. In the view shown in FIG. 6, it can be seen that the fins of the baffle plate may terminate at different vertical heights. However, reference to the termination of the fins at different vertical heights may depend upon their orientation. Hence, in general terms, it should be considered that the fins terminate at different levels. Alternatively, it may be considered that the tip levels of the fins terminate in at least two different planes.

The embodiment shown in FIG. 6 may be compared to the known design shown in FIG. 2. The baffle plate illustrated in FIG. 6 includes fins that terminate in two different planes. Accordingly, the embodiment shown in FIG. 6 includes taller fins 31 and shorter fins 33. In some embodiments, it may be desirable for the fins to terminate in more than two planes.

The spacing 17 between the fins 31 and 33 may be about the same as the spacing 17 between the fins 3 in the known design illustrated in FIG. 2. The difference in the lengths of the fins shown in FIG. 6 is represented by 39. The fins are separated by slits 37. The shorter fins 33 have a length 41.

Although FIG. 6 illustrates a baffle plate that includes fins having two different heights, as stated above, the fins may have more than two heights. Preferably, adjacent fins have different heights. By providing slits that have different heights, lateral expansion of material deposited on the slits occurs at different elevations. Such a design, according to simple geometry, may decrease the rate of constriction of the slits between the fins by about 50%. However, due to the spacing of the fins, the slits may not permit any detrimental increase in material passing through the baffle plate.

Figure 7:
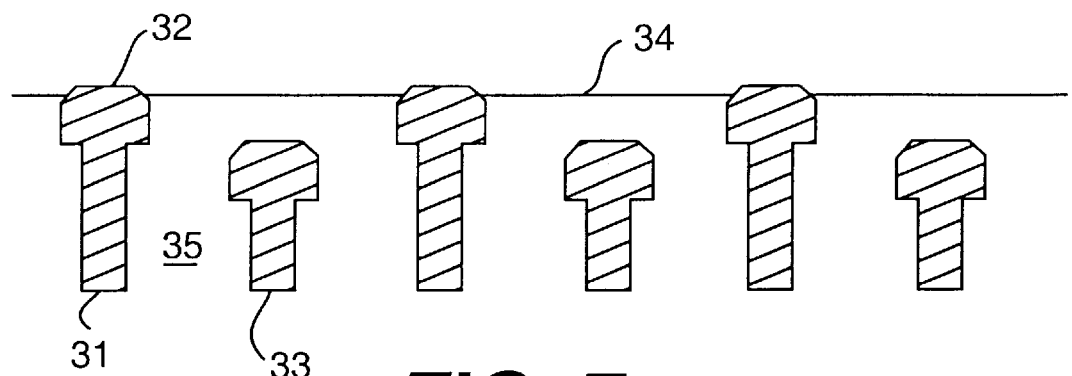
FIG. 7 represents a cross-sectional view of another embodiment of a baffle plate according to the present invention.

The top surface of the fins 31 may be beveled to further improve performance of the baffle plate. Furthermore, as illustrated in FIG. 7, the fins 31 may have a T-shaped top cap 32. The edges of this T-shaped cap may also be beveled. Line 34 represents a mid point of the beveled edge of the caps 32.

In the embodiment shown in FIG. 7, the shorter fins have a length of about 0.126 inch while the taller fins have a length of about 0.159 inch.

Although the spacing between the fins may remain the same as compared to known baffle plate designs, the thickness of areas joining the fins, such as the area 9 illustrated in FIG. 1, may be thicker so as to permit taller fins to be included in the baffle plate. According to some embodiments, the top of the taller slots will be at the same level in the processing chamber as the top of the slots in a baffle plate including a known baffle plate design, such as FIGS. 2 and 3 show. In other words, the shorter fins will be recessed as compared to the top level of slots in known designs.

According to some embodiments, the fins of the baffle plate are arranged in a mesh pattern.

Figure 8:
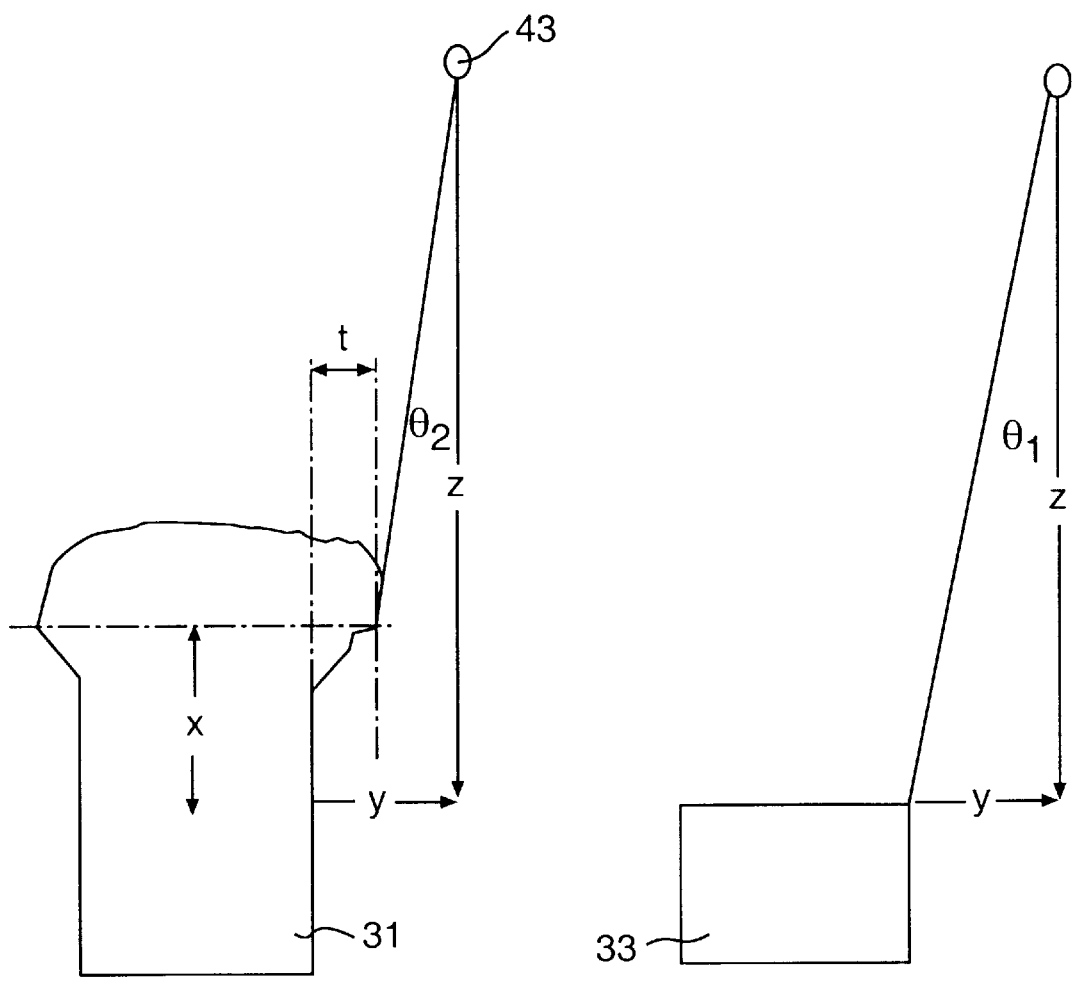
FIG. 8 represents a cross-sectional view of two adjacent fins of an embodiment of a baffle plate according to the present invention illustrating build-up on one of the fins and angular relationships related to the fins.

FIG. 8 illustrates two fins of an embodiment of a baffle plate according to the present invention illustrating the angle excluded by the fins. FIG. 8 graphically illustrates an explanation of mechanisms for reducing loss of conductance. As an example of one embodiment of the present invention, FIG. 8 illustrates determination of additional elevation of slits by an increase in an included angle necessary to substantially double a time between cleanings of the apparatus.

To elucidate the operation of one embodiment of the present invention, FIG. 8 illustrates a gas particle 43 located above and between fins 31 and 33. To maintain adequate flow, gas particle 43 must pass between adjacent fins of the baffle plate. The angle including the gas particle can be expressed as either $\theta_3$ for a typical known baffle plate, or $\theta_2$ for an embodiment of a baffle plate according to the present invention. In FIG. 8, the elevation of the gas particle 43 is referred to as "z". The additional height over fins of an embodiment of a baffle plate according to the present invention as compared to a known baffle plate is illustrated as "x". "t" represents the thickness of material, such as polymer, built up on the fins. $\theta_1$ refers to an included angle for a typical baffle plate when no material, such as polymer, is deposited, in other words, when t=0.

As seen in FIG. 8, by increasing x, the additional elevation of fins, the included angle, $\theta_2$ is increased over that of the typical baffle plate, $\theta_3$. As an example, for an equivalent built up material thickness t, the present invention may be designed to include a similar conductance as a clean, without material build up, known baffle plate when x is chosen such that $\theta_2(t)=\theta_1$ (t=0) over an integral average of incoming particle positions (y,z).

Figure 9:
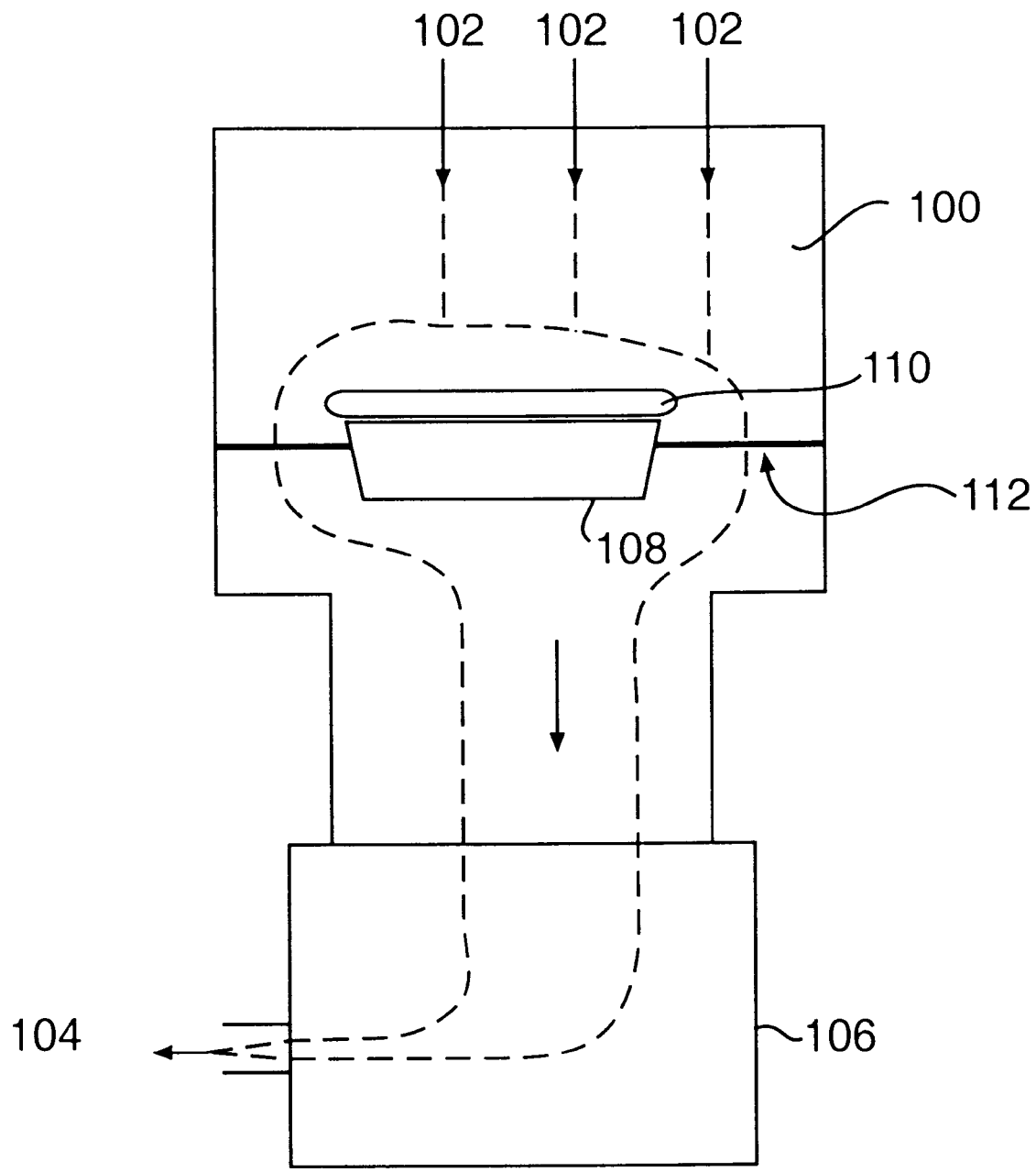
FIG. 9 represents an embodiment of a semiconductor processing chamber including a baffle plate according to the present invention.

The present invention also provides a semiconductor processing apparatus that includes a baffle plate according to the present invention. Typically, as illustrated in FIG. 9, a semiconductor processing apparatus includes a treatment chamber 100. The treatment chamber 100 typically includes at least one reactant inlet 102 and at least one reactant outlet 104. Typically, a pump 106 directs a flow of reactant from the inlet 102 to the outlet 104. A support 108 may be provided in the treatment chamber 100 for supporting a substrate 110 or workpiece to be treated in the chamber. The chamber 100 according to the present invention may also include a baffle plate 112 as described above. The arrows and broken lines in FIG. 9 illustrate the flow of gas and material through the apparatus.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A baffle plate for a semiconductor processing apparatus, said baffle plate comprising:

a plurality of slits;

a plurality of fins between adjacent slits, said fins having varying heights; and a supporting portion interconnecting said fins.

2. The baffle plate according to claim 1, wherein said fins have two different heights, and wherein said fins are of alternating heights.

3. The baffle plate according to claim 1, wherein each of said fins includes an head portion that overhangs a shaft portion.

4. The baffle plate according to claim 1, wherein a top of each of the fins is beveled.

5. The baffle plate according to claim 2, wherein said fins are either short or tall and a height of said fins is determined based upon the following equations:

$$\theta_3 = \tan^{-1}[(y-t)/z],$$

wherein $\theta_3$ is an angle excluded by the short fins, y and z are a position of a molecule to pass through said slits, and t is a thickness of material deposited on said fins, $$\theta_2 = \tan^{-1}[(y-t)/(z-x)],$$

wherein $\theta_2$ is an angle excluded from the tall fins, t, y, and z are as defined above, and x is a difference in elevation of adjacent slits.

6. The baffle plate according to claim 5, wherein $\theta_2$ is greater than $\theta_3$.

7. The baffle plate according to claim 1, wherein said baffle plate is ring-shaped and further comprising a central workpiece-receiving portion.

8. The baffle plate according to claim 1, wherein said fins are arranged in a mesh pattern.

9. The baffle plate according to claim 1, wherein said adjacent fins have different heights.

10. The baffle plate according to claim 1, wherein an upper surface of said fins terminates in two different planes.

11. The baffle plate according to claim 1, wherein spacing between said fins permits molecular flow of a treatment material between said fins.

12. A semiconductor processing apparatus, comprising:
a treatment chamber;
a support for a substrate to be treated;
a reactant inlet;
a reactant outlet;
a pump for directing of said reactant out of said chamber through said reactant outlet; and
a baffle plate that said reactant passes through prior to exiting said chamber, said baffle plate including a plurality of slits, a plurality of fins between said slits, said fins having varying heights, and a supporting portion interconnecting said fins.

13. The semiconductor processing apparatus according to claim 12, wherein an upper surface of said fins terminates in two different planes, and wherein said fins are of alternating heights.

14. The semiconductor processing apparatus according to claim 12, wherein each of said fins includes an head portion that overhangs a shaft portion.

15. The semiconductor processing apparatus according to claim 12, wherein a top of each of the fins is beveled.

16. The semiconductor processing apparatus according to claim 12, wherein said fins are either short or tall and a height of said fins is determined based upon the following equations:

$$\theta_3 = \tan^{-1}[(y-t)/z],$$

wherein $\theta_3$ is an angle excluded by the short fins, y and z are a position of a molecule to pass through said slits, and t is a thickness of material deposited on said fins, $$\theta_2 = \tan^{-1}[(y-t)/(z-x)],$$

wherein $\theta_2$ is an angle excluded from the tall fins, t, y, and z are as defined above, and x is a difference in elevation of adjacent slits.

17. The semiconductor processing apparatus according to claim 16, wherein $\theta_2$ is greater than $\theta_3$.

18. The semiconductor processing apparatus according to claim 12, wherein said baffle plate is ring-shaped and further comprising a central workpiece-receiving portion.

19. The semiconductor processing apparatus according to claim 12, wherein said fins are arranged in a mesh pattern.

20. The semiconductor processing apparatus according to claim 12, wherein said adjacent fins have different heights.

21. The semiconductor processing apparatus according to claim 12, wherein said semiconductor processing apparatus is a plasma etching chamber.

* * * * *